United States Patent [19]

Jos

[11] Patent Number: 6,020,617
[45] Date of Patent: Feb. 1, 2000

[54] LATERAL MOS TRANSISTOR WITH WEAKLY DOPED DRAIN EXTENSION

[75] Inventor: Hendrikus F. F. Jos, Nijmegen, Netherlands

[73] Assignee: U.S. Philips Corporation, New York, N.Y.

[21] Appl. No.: 09/083,698

[22] Filed: May 21, 1998

[30] Foreign Application Priority Data

May 23, 1997 [EP] European Pat. Off. .............. 97201541

[51] Int. Cl.[7] ........................... H01L 29/76; H01L 29/94; H01L 31/062; H01L 31/113; H01L 31/119

[52] U.S. Cl. ........................ 257/401; 257/344; 257/382; 257/386; 257/397; 257/408

[58] Field of Search .................... 257/344, 382, 257/386, 397, 401, 408

[56] References Cited

U.S. PATENT DOCUMENTS 5,731,614  3/1998  Ham ........................................ 257/355
5,883,415  3/1999  Tsuboi ..................................... 257/355

OTHER PUBLICATIONS

"High Performance Silicon LDMOS Technology for 2GHz RF Power Amplifier Applications", by Wood et al., IEDM pp. 87–90.

*Primary Examiner*—Ngân V. Ngô
*Attorney, Agent, or Firm*—Steven R. Biren

[57] ABSTRACT

A lateral MOS transistor is described, in particular, though not exclusively, a transistor of the lateral DMOS type, in which the drain is provided with a weakly doped drain extension (8) to increase the breakdown voltage. This drain extension is also present at the ends of the drain digits, so that the "hard" drain (5) does not continue up to the edge (7) of the active region (6), but is separated therefrom by an interposed region. These regions do not contribute to the transistor effect. To reduce parasitic input capacitances, which correspond to these non-active regions, the gate poly (9) is provided in the active portion of the transistor only and is replaced in the non-active portions by poly (22) which is connected through to the source (4, 16). This poly acts as a gate which is permanently at 0 V, so that leakage currents in the non-active regions are prevented.

10 Claims, 2 Drawing Sheets

LATERAL MOS TRANSISTOR WITH WEAKLY DOPED DRAIN EXTENSION

SUMMARY OF THE INVENTION

The invention relates to a semiconductor device comprising a semiconductor body which is provided with a lateral MOS transistor at a surface, said semiconductor body comprising a comparatively weakly doped region of a first conductivity type adjoining the surface, in which region an active region is defined by a pattern of field oxide, which transistor comprises a source and a drain in the form of strongly doped surface zones of the opposed, second conductivity type which extend into the active region between two mutually opposed sides of the active region, said drain being provided with a weakly doped drain extension of the second conductivity type extending between the strongly doped drain zone and a channel region of the transistor situated between the drain extension and the source zone, while a gate electrode is provided above the channel region and electrically insulated therefrom. The field oxide may be formed, when a semiconductor body of silicon is used, for example, by an oxide pattern which is at least partly recessed into the semiconductor body and which is obtained through local oxidation of the silicon (LOCOS). The field oxide may also be formed by a groove filled up with oxide along the edge of the active region. The transistor may have a multi-digit structure, where the source and the drain are formed by a number of zones interdigitated with one another. The transistor may further be of the usual type in which the back-gate region is formed by the active region. The transistor may also be of the lateral DMOS type where the back-gate region (with the channel therein) is formed by a diffused zone of the first conductivity type.

Such a transistor is described, for example, in the article "High performance silicon LDMOS technology for 2 GHz RF power amplifier applications", by A. Wood et al., in IEDM 96, pp. 87–90.

The drain extension renders it possible to increase the maximum admissible voltage at which the transistor can be operated. A further important quantity of the transistor is the input capacitance, i.e. the parasitic capacitance between gate and ground (source). It is important that the input capacitance should be as low as possible in high-frequency applications of the transistor, for example in the RF range. The invention accordingly has for its object inter alia to reduce considerably the input capacitance of a MOS transistor described above as compared with prior art transistors.

SUMMARY OF THE INVENTION

According to the invention, a semiconductor device of the kind described in the opening paragraph is for this purpose characterized in that the strongly doped drain zone extends only over part of the width of the active region and is separated from said sides of the active region by an interposed, weakly doped surface region, while the gate electrode, seen at the surface, extends at least substantially over a corresponding portion of the width of the active region, and the regions situated between the gate electrode and the field oxide are covered by a conductive layer which is conductively connected to the source. The invention is based inter alia on the recognition that the space between the field oxide and the (hard) drain has no or at least practically no transistor function in usual versions in which the gate extends from field oxide to field oxide. These portions of the transistor do contribute to the input capacitance, but not to the transistor function. Usually, the space between the drain and the field oxide is considerable, for example 10 $\mu$m. Given an effective gate length of, for example, 75 to 100 $\mu$m, there is thus a fraction of 20 $\mu$m which in fact contributes to the parasitic capacitance only.

This capacitance can be eliminated in that, according to the invention, the gate is provided only in the active region of the transistor and is replaced by a conductor connected to the source in the non-active regions, while at the same time leakage currents in the non-active regions are prevented by the conductor which acts as a gate which is permanently grounded.

Although the drain extension is allowed to extend up to the field oxide in some cases, a preferred embodiment of the invention is characterized in that the drain extension, seen at the surface, extends over part of the distance between the strongly doped drain zone and said sides of the active region and is separated from these sides of the active region by an interposed portion of the comparatively weakly doped region of the first conductivity type.

A major embodiment which has the advantage inter alia that no additional process steps are required, as compared with transistors having a conventional construction is characterized in that the gate electrode and the conductive layer situated between the gate electrode and the field oxide are manufactured from a common conductive layer, in particular from polycrystalline silicon. A simple embodiment is characterized in that the source zone is connected to a metal source contact which is also connected to the conductive layer between the gate electrode and the field oxide.

A further important embodiment of a semiconductor device according to the invention is characterized in that the device is covered with a dielectric layer in which windows are provided through which the source, the drain, and the gate electrode are connected to a metal source contact, a metal drain contact, and a metal gate contact, respectively, said source contact being conductively connected via a contact zone of the first conductivity type to a comparatively strongly doped substrate region of the first conductivity type which is situated below the comparatively weakly doped surface region of the first conductivity type. The gate resistance can be kept low in that the gate, which is usually made of doped polycrystalline silicon, is provided with a metal contact strip, which is favorable for the high-frequency properties of the transistor. A preferred embodiment, which has the advantage of a very low drain-gate capacitance, is characterized in that a further metal strip is provided on the dielectric layer between the gate contact and the drain contact and is conductively connected to the source. The effect of the additional screening electrode between the gate contact strip and the drain contact in a lateral DMOS transistor forms the subject matter of European patent application no. 97201272.8 (PHN 16.332), entitled Semiconductor Device, filed Apr. 28th, 1997 by applicant, the contents of which application are deemed to be included in the present application by reference.

BRIEF DESCRIPTION OF THE DRAWING

These and other aspects of the invention will be explained in more detail with reference to an embodiment. In the drawing.

Figure 1:
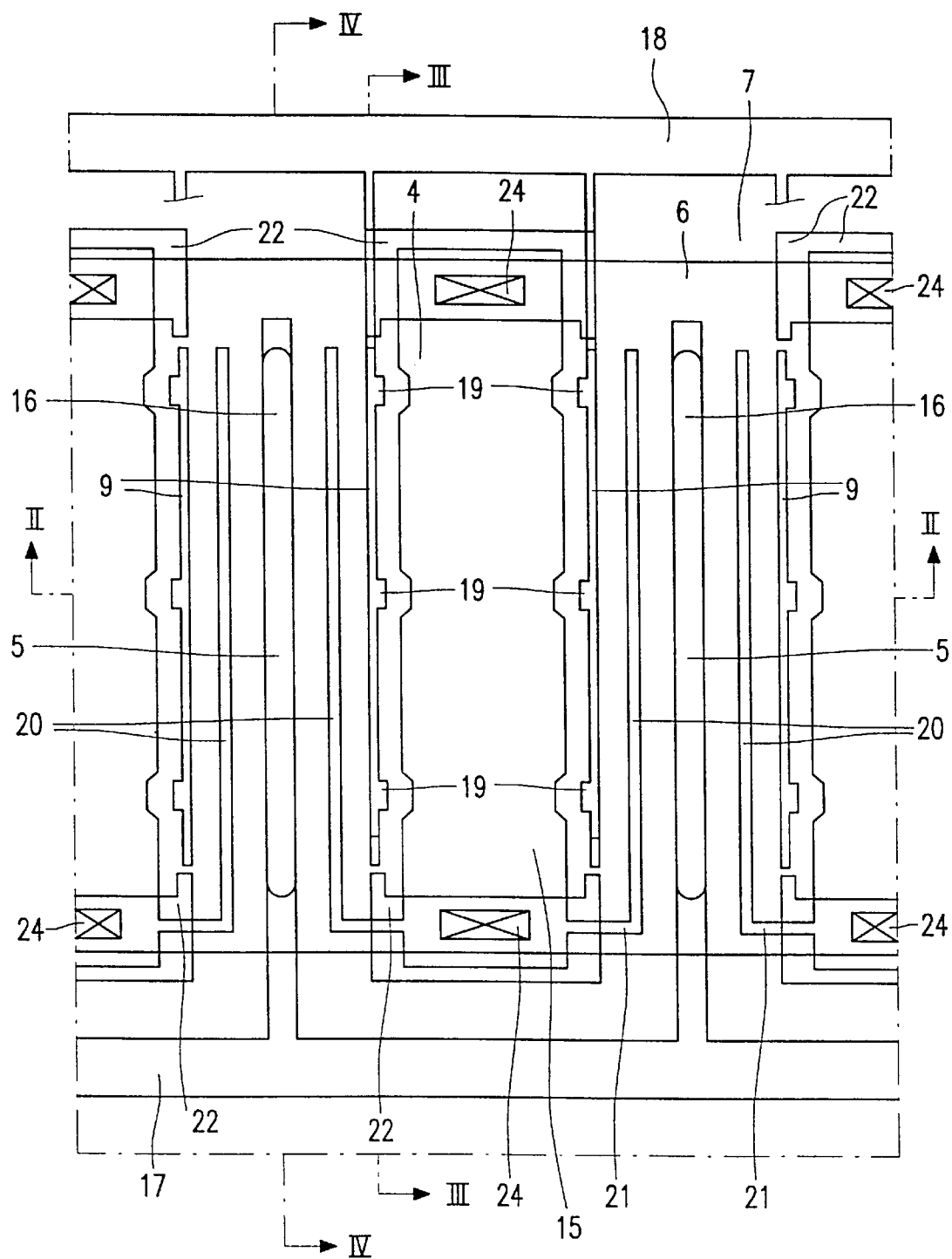
FIG. 1 is a plan view of a semiconductor device according to the invention.
Figure 2:
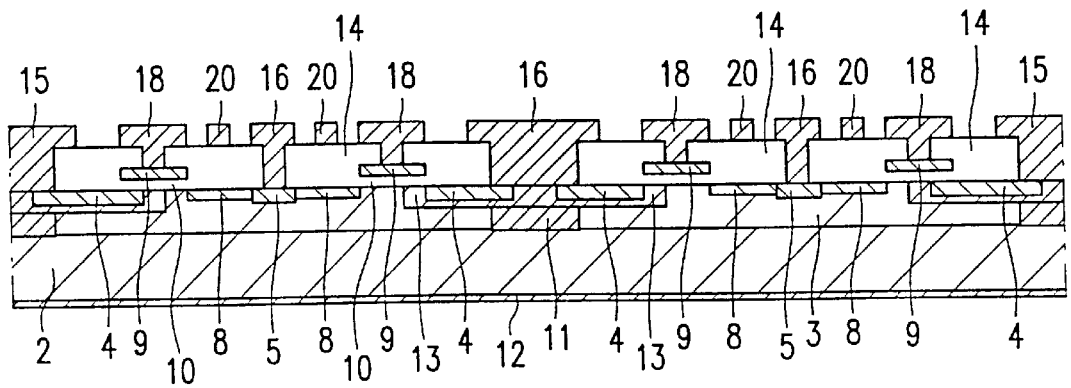
FIG. 2 is a cross-section of this device taken on the line II—II.

It is noted that the drawing is diagrammatic only and not true to scale.

DESCRIPTION OF THE PREFERRED EMBODIMENTS

The device comprises a semiconductor body 1 which in this example is made of monocrystalline silicon, but which may obviously be made from an alternative semiconductor material suitable for the purpose. The semiconductor body is built up from a low-ohmic, strongly doped substrate 2 of a certain conductivity type and a comparatively weakly doped high-ohmic region 3 of the same conductivity type as the substrate and adjoining the surface. The substrate 2 and the layer 3 are of the p-type in the present example of an n-channel MOS transistor. In the case of a p-channel transistor, to which the invention also relates, the opposite conductivity types should be taken for the various regions of the semiconductor body as compared with the conductivity types mentioned here. The surface region 3 is formed here, by way of example, by a surface layer provided epitaxially on the substrate 2. The thickness of the epi layer 3 lies between 5 and 10 µm, and the doping concentration between $10^{15}$ and $10^{16}$ boron atoms per $cm^3$. The doping concentration of the substrate 2 used for connection to the source is much higher and lies, for example, between $10^{19}$ and $10^{20}$ boron atoms per $cm^3$. An active region 6 is defined in the layer 3, bounded laterally by thick field oxide 7. As the drawing shows, the field oxide may be recessed into the semiconductor body over at least part of its thickness. The source and drain zones of the transistor are formed by strongly doped n-type surface zones 4 and 5, respectively, which extend between the two sides of the active region shown in FIG. 1. The transistor in this embodiment comprises a multi-digit structure with a number of digits situated next to one another, alternately belonging to the source and to the drain. In spite of the fact that the source and the drain comprise a (possibly large) number of zones, the source and drain will be indicated with the reference numerals 4 and 5 hereinafter for simplicity's sake.

To increase the breakdown voltage, the drain is provided with a weakly doped drain extension 8 between the strongly doped drain zones 5 and the transistor channel. The length of the drain extension has a value of between, for example, 1 and 10 µm, depending on the application. The channel of the transistor is formed by the p-type regions between the extensions 8 and the source zones 4. The gate 9 is provided above the channel in the form of strip-shaped conductors of polycrystalline (poly) or amorphous silicon with a thickness of between 0.4 and 1 µm, between the source digits and the extensions 8 of the drain digits. A gate dielectric 10, in this example an oxide layer having a thickness of between 40 and 100 nm, is provided between the gate electrode 9 and the surface of the semiconductor body.

The substrate 2 is provided at its lower side with an electrode 12 which forms a connection between the source and an external connection terminal which is not shown in the drawing. The source zone or zones is/are short-circuited with a strongly doped p-type zone 11 which extends transversely across the layer 3 up to the substrate 2. To obtain a sufficiently high breakdown voltage, the transistor is constructed as a DMOST in this example, in which a p-type diffused zone 13 is provided in the channel so as to act as an additional p-type doping with respect to the epi layer 3. The surface is covered with a thick glass layer 14 provided with windows for connecting subjacent regions to metal contacts provided on the glass layer 14. The source and drain zones are connected to a source electrode 15 and a drain electrode 16, respectively. The source contact 15 is connected not only to the n-type source zone 4 but also to the deep p-type zone 11, thus forming a connection between the source and the substrate connection 12. The drain electrode 16 comprises metal strips which form a comb structure together with the basic portion 17 (FIG. 1) and which are connected via the basic portion 17 to a bond pad elsewhere on the crystal.

Figure 3:
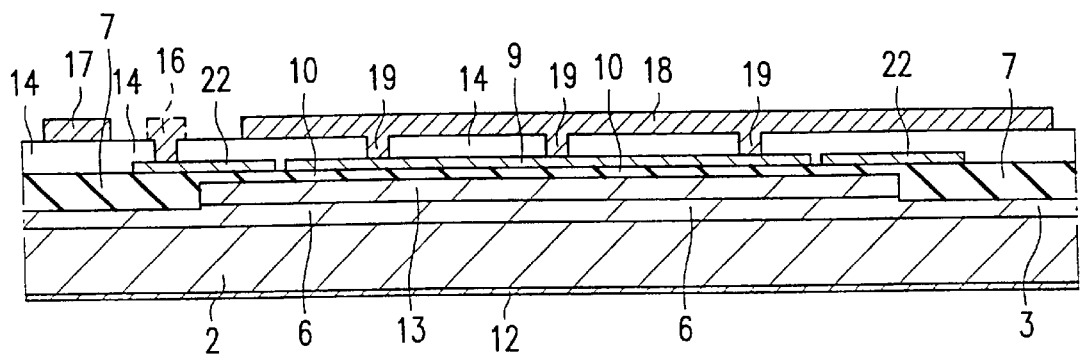
FIG. 3 is a cross-section of this device taken on the line III—III.

The gate electrode 9 is connected to a metal contact in the form of metal strips 18 between the metal strips 15 and 16. Because of the small width of the gate 9, the metal track 18 is not connected to the gate 9 over its entire length, but in a number of interspaced locations where the poly gate 9 has been given widened portions for the contacts, as shown in FIG. 3. Provided the distances between the connection locations 19 are sufficiently small, the gate resistance is at least substantially determined by the resistance of the metal tracks 18. A low gate resistance can be obtained thereby when a metal having a low resistivity, for example Au, is used. As is visible in FIG. 1, the gate contact 18 also has a comb shape, forming an interdigitated structure together with the drain electrode 16, 17.

Further metal tracks 20, which are connected to the source contact 15 beyond the tips of the tracks 18 via connections 21, are provided between the metal tracks 16 of the drain contact and the metal tracks 18 of the gate contact. These electrodes 20, which are the subject of the European application no. 97201272.8 filed by applicant and mentioned above, have the advantage that the parasitic drain-gate capacitance is considerably reduced. Moreover, the screening electrodes 20 can be manufactured together with the source contacts 15, the drain contacts 16, 17, and the gate contacts 18 in a single, common metallization layer, so that additional process steps are avoided.

Figure 4:
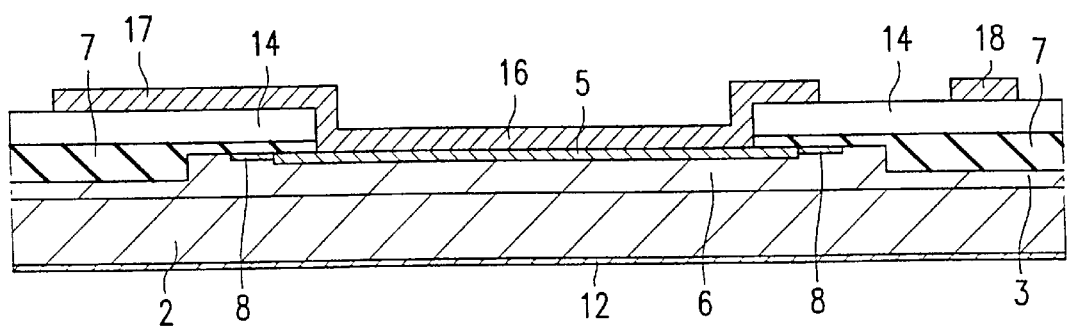
FIG. 4 is a cross-section of the same device taken on the line IV—IV.

As FIG. 4 shows, the (strongly doped) n-type drain zone 5 extends over only part of the width of the active region 6 in view of the breakdown voltage, such that the ends of the n-type digits 5 lie at a distance from the field oxide 7 and are separated from the field oxide 7 by the weakly doped n-type extensions 8 which are also present at the ends. In principle, the drain extensions may continue up to the field oxide 7. In the embodiment shown here, the drain extensions 8 are separated from the field oxide by an interposed portion of the p-type region 6 in order to prevent leakage currents along the edge of the active region 6. In a practical embodiment, the distance between the drain and the edge of the active region is approximately 10 µm. The gate electrode 9 also does not extend over the entire width of the active region 6, but extends over only a portion of the active region which corresponds at least substantially to the strongly doped drain zone(s) 5. A conductive layer 22, which is conductively connected to the source 4, is provided on the gate oxide 10 above the surface portions of the active region 6 between the gate electrode 9 and the field oxide 7. In the present example, the conductive layers 22 are formed by layers of polycrystalline silicon which are provided simultaneously with and in the same process steps as the gate electrode 9, i.e. the gate electrode 9 and the layer portions 22 are manufactured from a common polycrystalline silicon layer. As is evident from FIG. 1, the conductive layers 22 form a continuous layer portion 22 on either side of a source zone 4, which portion, seen at the surface, extends to above the field oxide at an end of a source digit, between the source digit and the field oxide, and is contacted by the metal source contact 16 at the area of contact windows 24 in the oxide layer 14. Such a contact is indicated with broken lines in FIG. 3. The strongly doped source zones 4 may be provided over the full width of the active region 6, if so desired. Preferably, however, the zones 4 are formed over only a portion of the width of the active region, by analogy to the zones 5, so that the source digits 4 do not adjoin the LOCOS but a portion of the p-type region 6 is situated between the source digits 4 and the field oxide 7.

In the transistor described here, the space between the drain 5 proper and the field oxide 7 is considerable, for example 10 μm on either side of the drain digits for a specific length of the drain digits of 75 to 100 μm. If the gate electrode 9 were to extend transversely across the entire width of the active region 6, as in conventional transistors, the portions where the drain is not present will not or at least substantially not contribute to the transistor effect, but will contribute to the input capacitance of the transistor, which should preferably be kept as low as possible in view of the transistor behavior at high frequencies. There will be a portion of 20 μm then as part of an effective gate length of 75 to 100 μm which merely increases the parasitic capaictance. In the transistor according to the invention as described here, this capacitance is eliminated in that the gate poly is provided in the active portion of the transistor only, and is replaced by poly connected to the source in the non-active portion. This latter poly acts as a gate electrode which is kept permanently at a voltage of 0 V, whereby leakage currents through the non-active portion of the transistor are prevented. It is noted that part of the channel is not covered with poly owing to the gap between the gate 9 and the poly layer 22. This gap, however, may be made so small that the surface potential in this region is nevertheless partly defined by the gate 9, partly by the poly layer 22, so that leakage currents can be prevented also in this region. Apart from a low input capacitance, the transistor described here also has a low gate-drain capacitance owing to the presence of the screening electrodes 20 between the gate and the drain. This renders the transistor highly suitable for high frequencies, in particular in the RF frequency range.

The transistor, furthermore, can be manufactured by means of techniques which are known per se.

It will be obvious that the invention is not limited to the embodiment described here, but that many more variations are possible to those skilled in the art within the scope of the invention. Thus the invention can also be used to advantage in p-channel MOS transistors. The invention may be used not only in transistors of the DMOS type, but also in transistors without diffused back-gate regions 13, where the channel is formed by a surface region of the epi layer 3.

What is claimed is:

1. A semiconductor device comprising a semiconductor body which is provided with a lateral MOS transistor at a surface, said semiconductor body comprising a comparatively weakly doped region of a first conductivity type adjoining the surface, in which region an active region is defined by a pattern of field oxide, which transistor comprises a source and a drain in the form of strongly doped surface zones of the opposed, second conductivity type which extend into the active region between two mutually opposed sides of the active region, said drain being provided with a weakly doped drain extension of the second conductivity type extending between the strongly doped drain zone and a channel region of the transistor situated between the drain extension and the source zone, while a gate electrode is provided above the channel region and electrically insulated therefrom, characterized in that the strongly doped drain zone extends only over part of the width of the active region and is separated from said sides of the active region by an interposed, weakly doped surface region, while the gate electrode, seen at the surface, extends at least substantially over a corresponding portion of the width of the active region, and the regions situated between the gate electrode and the field oxide are covered by a conductive layer which is conductively connected to the source.

2. A semiconductor device as claimed in claim 1, characterized in that the field oxide is recessed into the semiconductor body over at least part of its thickness.

3. A semiconductor device as claimed in claim 1, characterized in that the drain extension, seen at the surface, extends over part of the distance between the strongly doped drain zone and said sides of the active region and is separated from these sides of the active region by an interposed portion of the comparatively weakly doped region of the first conductivity type.

4. A semiconductor device as claimed in claim 1, characterized in that the strongly doped source zone also extends into the active region over only part of the width of the active region which corresponds to the drain zone.

5. A semiconductor device as claimed in claim 1, characterized in that the gate electrode and the conductive layer situated between the gate electrode and the field oxide are manufactured from a common conductive layer, in particular from polycrystaline silicon.

6. A semiconductor device as claimed in claim 1, characterized in that the source zone is connected to a metal source contact which is also connected to the conductive layer between the gate electrode and the field oxide.

7. A semiconductor device as claimed in claim 6, characterized in that the conductive layer, seen at the surface, extends between the source and the field oxide.

8. A semiconductor device as claimed in claim 1, characterized in that the transistor is of the lateral DMOS type, wherein the source and the channel region are situated in a diffused surface zone of the first conductivity type which forms a back-gate region of the transistor.

9. A semiconductor device as claimed in claim 1, characterized in that the device is covered with a dielectric layer in which windows are provided through which the source, the drain, and the gate electrode are connected to a metal source contact, a metal drain contact, and a metal gate contact, respectively, said source contact being also conductively connected via a contact zone of the first conductivity type to a comparatively strongly doped substrate region of the first conductivity type which is situated below the comparatively weakly doped surface region of the first conductivity type.

10. A semiconductor device as claimed in claim 9, characterized in that a further metal strip is provided on the dielectric layer between the gate contact and the drain contact and is conductively connected to the source.

* * * * *